United States Patent
Karve et al.

(10) Patent No.: US 12,374,675 B2
(45) Date of Patent: Jul. 29, 2025

(54) METHOD OF PRODUCING HYBRID SEMICONDUCTOR WAFER

(71) Applicant: IMEC VZW, Leuven (BE)

(72) Inventors: Gauri Karve, Tervuren (BE); Yunlong Li, Heverlee (BE); Luc Haspeslagh, Lubbeek (BE); Philippe Soussan, Wavre (BE); Deniz Sabuncuoglu Tezcan, Herent (BE)

(73) Assignee: IMEC VZW, Leuven (BE)

( * ) Notice: Subject to any disclaimer, the term of this patent is extended or adjusted under 35 U.S.C. 154(b) by 411 days.

(21) Appl. No.: 18/055,763

(22) Filed: Nov. 15, 2022

(65) Prior Publication Data

US 2023/0154914 A1  May 18, 2023

(30) Foreign Application Priority Data

Nov. 16, 2021 (EP) .................................... 21208577

(51) Int. Cl.
*H01L 25/00* (2006.01)
*H01L 21/56* (2006.01)

(52) U.S. Cl.
CPC ............ *H01L 25/50* (2013.01); *H01L 21/561* (2013.01); *H01L 21/568* (2013.01)

(58) Field of Classification Search
CPC ..... H01L 25/50; H01L 21/561; H01L 21/568; H01L 24/83
See application file for complete search history.

(56) References Cited

U.S. PATENT DOCUMENTS

| 6,066,513 A | 5/2000 | Pogge et al. |
|---|---|---|
| 7,176,107 B2 | 2/2007 | Hsu et al. |

(Continued)

FOREIGN PATENT DOCUMENTS

| CN | 107342215 A | 11/2017 |
|---|---|---|
| CN | 112764158 A | 5/2021 |

OTHER PUBLICATIONS

European Search Report in European Application No. EP 21208577.3 mailed on Sep. 6, 2022 in 20 pages.

(Continued)

*Primary Examiner* — Thao P Le
(74) *Attorney, Agent, or Firm* — Knobbe, Martens, Olson & Bear, LLP (57) ABSTRACT

According to a preferred embodiment of the method of the invention, an assembly is produced comprising a temporary wafer and one or more tiles that are removably attached to the temporary wafer, preferably through a temporary adhesive layer. The tiles comprise a carrier portion and an active material portion. The active material portion is attached to the temporary carrier. The assembly further comprises a single continuous layer of the first material surrounding each of the one or more tiles. Then the back side of the carrier portions of the tiles and of the continuous layer of the first material are simultaneously planarized, and the planarized back sides of the tiles and of the continuous layer of the first material are bonded to a permanent carrier wafer, after which the temporary carrier wafer is removed. The method results in a hybrid wafer comprising a planar top layer formed of the material of the continuous layer with one or more islands embedded therein, the top layer of the islands being formed by the top layer of the active material portion of the one or more tiles.

22 Claims, 7 Drawing Sheets

(56) References Cited

U.S. PATENT DOCUMENTS

| | | | |
|---|---|---|---|
| 9,911,602 | B2 | 3/2018 | Gallagher et al. |
| 10,319,642 | B2 | 6/2019 | Patil et al. |
| 11,011,410 | B2 | 5/2021 | Zhu et al. |
| 2011/0049694 | A1 | 3/2011 | Chandrasekaran et al. |
| 2011/0155297 | A1* | 6/2011 | Fuergut ............... H01L 21/6836 156/247 |
| 2013/0154106 | A1 | 6/2013 | Hu et al. |
| 2014/0357020 | A1 | 12/2014 | Aleksov et al. |
| 2015/0287687 | A1* | 10/2015 | Farrens ................. H01L 24/14 257/737 |
| 2016/0358898 | A1* | 12/2016 | Zhou ...................... H01L 24/96 |
| 2018/0301365 | A1 | 10/2018 | Kilcoyne et al. |
| 2019/0124772 | A1* | 4/2019 | Stahr ..................... H05K 1/185 |
| 2019/0355878 | A1 | 11/2019 | Ahmed |
| 2020/0212649 | A1 | 7/2020 | Bovington et al. |
| 2020/0395306 | A1 | 12/2020 | Chen et al. |
| 2021/0167195 | A1* | 6/2021 | Brockmeier .......... H01L 25/065 |
| 2023/0420399 | A1* | 12/2023 | Haba ....................... H01L 24/08 |

OTHER PUBLICATIONS

Corbett, Brian et al., "Heterogeneous integration of III-V based photonics with silicon." Proceedings of Spie, vol. 11301, Event: SPIE OPTO, 2020, San Francisco, California, United States, downloaded from https://www.spiedigitallibrary.org/conference-proceedings-of-spie on Jul. 26, 2021 in 8 pages.

Han, Yu, et al., "Bufferless 1.5 μm III-V lasers grown on Si-photonics 220 nm silicon-on-insulator platforms." *Optica*, vol. 7, No. 2 pp. 148-153, published on Feb. 3, 2020 in 6 pages.

Hu, Yingtao et al., "III/V-on-Si MQW lasers by using a novel photonic integration method of regrowth on a bonding template.", *Light: Science & Applications*, Official journal of the CIOMP 2047-7538, published on Oct. 9, 2019 in 9 pages.

Lee, Hong Kwang et al., "Monolithic Integration of Si-CMOS and III-V- on-Si Through Direct Wafer Bonding Process." Journal of the Electron Devices Society, vol. 6 pp. 571-578, published on Dec. 27, 2017 in 8 pages.

Manda S. et al. "High-definition Visible-SWIR InGaAs Image Sensor using Cu-Cu Bonding of III-V to Silicon Wafer." Sony Semiconductor Solutions Corporation, accessed on Jun. 21, 2021 in 4 pages.

* cited by examiner

METHOD OF PRODUCING HYBRID SEMICONDUCTOR WAFER

CROSS-REFERENCE TO RELATED APPLICATIONS

This application claims foreign priority to European Application No. 21208577.3, filed Nov. 16, 2021, the content of which is incorporated by reference herein in its entirety.

BACKGROUND

Field

The present disclosure is related to semiconductor processing, in particular to the production of electronic devices comprising different types of semiconductor materials such as Si combined with III-V materials.

Description of the Related Technology

Applications for III-V devices include imagers, high frequency devices, light-emitting diodes, and lasers. For many of these applications, it is desirable to integrate the III-V devices with silicon technology and take advantage of the performance and maturity of the read-out electronics made in silicon. Lattice mismatch and a difference in the coefficient of thermal expansion (CTE) between III-V materials and silicon make this task non-trivial.

It is known to bond III-V devices processed on 2-4-inch substrates to silicon-based complementary metal-oxide-semiconductor (CMOS) electronics by bump bonding. This approach has several limitations. Current commercially available III-V to Si imagers have minimum bump pitch of about 10 µm due to scaling limitations of the bump technology. In addition, 2-4-inch processing facilities have difficulty scaling dimensions due to tool limitations. This impacts the achievable performance for high speed III-V devices.

Another known approach is the fabrication of hybrid wafers by epitaxial growth of III-V material on a Si process wafer. This approach suffers from lattice mismatch issues, resulting in unwanted defects.

SUMMARY OF CERTAIN INVENTIVE ASPECTS

This disclosure aims to provide a method and a structure of a hybrid wafer that answers to the above-identified problems. The disclosure in particular relates to a method for producing a hybrid wafer configured to be processed for producing one or more semiconductor components.

According to a preferred embodiment, an assembly is produced comprising a temporary wafer and one or more tiles that are removably attached to the temporary wafer, preferably through a temporary adhesive layer. The tiles can comprise a carrier portion and an active material portion. The active material portion can be attached to the temporary carrier. The assembly further comprises a single continuous layer surrounding each of the one or more tiles. Then the back side of the carrier portions of the tiles and of the continuous layer of the first material can be simultaneously planarized, and the planarized back sides of the tiles and of the continuous layer of the first material can be bonded to a permanent carrier wafer, after which the temporary carrier wafer can be removed. The method results in a hybrid wafer comprising a planar top layer formed of the material of the continuous layer with one or more islands embedded therein, the top layer of the islands being formed by the top layer of the active material portion of the one or more tiles.

An active material in the present context can refer to a semiconductor material suitable for processing either active semiconductor devices thereon such as transistors and diodes produced for example by CMOS type processing, and/or a material suitable for patterning of the material to form, for example, gratings or other types of metasurfaces. In some embodiments, the active material is a III-V semiconductor material.

A continuous layer can be a layer that forms a single body of material extending in the areas between and around the islands.

The term embedded therein does not exclude that a filled-up gap can exist between the islands and the continuous layer, the gap being filled with a material that may be different from the materials of the continuous layer and of the islands.

The term surrounding can mean one of two possible options: either there is no gap between the tiles and the continuous layer, or a small gap exists between the tiles and the continuous layer, the gap being small with respect to the planar dimensions of the tiles, for example a gap of a few tens of micrometers for a tile having dimensions in the order of millimeters.

The terms planarization and planarizing in the present context can refer to mechanical material removal techniques such as grinding or chemical mechanical planarization (CMP) which result in rendering non-coplanar surfaces coplanar and/or in thinning an already planar surface. Layer removal techniques other than planarization include the removal by etching, cleaning, or solvent removal.

From the above, it is clear that the term temporary carrier wafer can refer to a wafer that carries the tiles temporarily, e.g., the tiles are bonded to the temporary carrier wafer by a releasable bond, such as a releasable adhesive layer. It is clear therefore that the term 'permanent carrier wafer' can refer to the opposite, e.g., a wafer to which the tiles are bonded permanently, for example by a strong dielectric-to-dielectric bond obtained by a direct bonding process known as such in the art.

Some embodiments relate to a method for producing a hybrid wafer configured to be processed for producing one or more semiconductor components, the method comprising the steps of:
  producing one or more tiles comprising a semiconductor carrier portion and an active semiconductor material portion on the carrier portion so that the back side of the carrier portion forms the back side of the tile and the active material portion is located at the front side of the tile, wherein one or more additional layers may be present on the active material portion,
  producing an assembly comprising:
    a temporary carrier wafer,
    the one or more tiles removably attached face down to the temporary carrier wafer, so that the back side of the tiles is facing away from the carrier wafer,
  if the back side of the assembly is not planar, planarizing the assembly, so that the back sides of the tiles are rendered essentially coplanar,
  bonding the assembly to a permanent carrier wafer by bonding the coplanar back sides of the one or more tiles to the permanent carrier wafer, wherein:
the active material is a semiconductor material suitable for processing active semiconductor devices thereon, and/or a material suitable for patterning of the material,
the active material portion comprises a top layer that is either a pristine layer, i.e. a layer that has not been processed or patterned, or a layer that has been processed or patterned before being removably attached to the temporary carrier wafer,
a continuous layer surrounds the one or more tiles,
the continuous layer is either part of the assembly or is formed after bonding the assembly to the permanent carrier wafer,
the continuous layer is formed of a material that is different from at least the top layer of the active material portion of the tiles,
the method further comprises removing the temporary carrier wafer, and if one or more additional layers are present on the active material portion of the tiles, removing the one or more additional layers, thereby obtaining the hybrid wafer, comprising the permanent wafer and bonded thereto a planar top layer formed of the material of the continuous layer with one or more islands embedded therein, the top layer of the islands being formed by the top layer of the active material portion of the one or more tiles.

In the method disclosed herein, one or more additional layers may include a protective dielectric layer applied on the active material portion. Such a layer may be optional, or may be required in certain embodiments, as will be described in the detailed description. When such layers are present, this means that when the tiles are attached face down to the temporary carrier wafer, the additional layer or layers can actually be attached to the temporary carrier wafer. The removal of the one or more additional layers takes place by removal steps which do not include planarization of the active material portion of the tiles. For example, the protective dielectric layer may be removed by solvent removal, so that the active material portion is exposed without having been affected by a planarization method such as grinding or CMP.

According to an embodiment:
the assembly comprises the continuous layer surrounding each of the one or more tiles, wherein the continuous layer is also removably attached to the temporary carrier wafer, so that the back side of the continuous layer is facing away from the carrier wafer,
the method comprises the steps of:
  planarizing the assembly, so that the back sides of the tiles and of the continuous layer are rendered essentially co-planar,
  bonding the assembly to the permanent carrier wafer by bonding the coplanar back sides of the one or more tiles and of the continuous layer to the permanent carrier wafer.

In the previous embodiment, the continuous layer of the first material may be formed by a pocket wafer, and the assembly may be produced by the steps of
producing the pocket wafer, the pocket wafer comprising one or more cavities through the complete thickness of the pocket wafer, the shape of the one or more cavities corresponding respectively to the shape of the one or more tiles so that the one or more tiles can be placed respectively inside the one or more cavities. From the detailed description, it is clear that the term 'corresponding to' means that the shape of the tiles is essentially the same as the shape of the cavities, with the dimensions of the tiles being somewhat smaller than the dimensions of the cavities so that the tiles can be placed in the cavities, for example by a pick-and-place tool, with a small gap appearing between the sidewalls of the placed tiles and the sidewalls of the cavities.
removably attaching the pocket wafer to the temporary carrier wafer,
placing the one or more tiles face down inside the respective one or more cavities.

The method according to the previous embodiment may further comprise the step of filling any gaps remaining between the one or more tiles and the sidewalls of the respective cavities after the tiles have been placed inside the cavities.

According to one embodiment, the tiles further comprise a protective layer on the active material portion, and the step of filling the gaps takes place after bonding the assembly to the permanent carrier wafer, by depositing a gap fill material in the gaps and on top of the tiles, wherein the method includes the planarization of the gap fill material and the removal of the protective layer.

According to an embodiment, the pocket wafer is a semiconductor wafer, for example a silicon wafer, a germanium wafer, a silicon-on-insulator wafer, or a silicon-germanium-on-insulator wafer, wherein the active material portion (6b) of the one or more tiles comprises at least a top layer of a III-V semiconductor material.

According to an embodiment, the pocket wafer and the permanent carrier wafer are semiconductor wafers having a diameter of 200 mm or 300 mm.

According to an embodiment, a first capping layer is formed on the one or more tiles and on the pocket wafer, after placing the one or more tiles in the cavities, and before the planarizing step.

According to an embodiment, a dielectric capping and/or bonding layer is formed on the one or more tiles and on the pocket wafer, after the planarizing step.

According to an embodiment, the temporary carrier wafer is provided with a temporary adhesive layer, wherein the tiles are removably attached to the temporary adhesive layer, and wherein the method includes the removal of the temporary adhesive layer.

According to another embodiment, the assembly is produced by the steps of:
producing one or more alignment markers on the temporary carrier wafer,
producing a temporary adhesive layer on the temporary carrier wafer,
attaching the one or more tiles to the temporary adhesive layer, using the one or more alignment markers for positioning the one or more tiles, thereby removably attaching the tiles to the carrier wafer,
depositing a layer of the material different from at least the top layer of the active material portion of the tiles on the temporary adhesive layer in the area surrounding each of the one or more tiles and on top of the tiles, wherein the layer forms the continuous layer surrounding each of the one or more tiles,
and wherein the method includes the removal of the temporary adhesive layer.

According to an embodiment, the tiles further comprise a protective layer on the active material portion, the continuous layer is not part of the assembly, and the assembly is produced by the steps of:
producing one or more alignment markers on the temporary carrier wafer, removably attaching the one or more tiles to the temporary carrier wafer using the one or more alignment markers for positioning the one or more tiles, the method further comprising the steps of:

bonding the essentially coplanar back sides of the tiles to a permanent carrier wafer, removing the temporary carrier wafer, depositing a layer of a material different from at least the top layer of the active material portion of the tiles in the area surrounding each of the one or more tiles and on top of the tiles, wherein the layer forms the continuous layer surrounding each of the one or more tiles, planarizing the continuous layer and removing the protective layer from the active material portion of the tiles, thereby obtaining the hybrid wafer.

According to an embodiment, the active material portion of the tiles comprises one or more layers that have been processed and/or patterned prior to the production of the tiles.

Some embodiments of the present disclosure are related to a method for producing at least one semiconductor component, the method comprising:

providing a hybrid wafer produced according to a method described herein, processing the hybrid wafer to thereby produce a semiconductor component on an area comprising a portion of the continuous layer and one or more of the islands, separating the component from the rest of the hybrid wafer.

DETAILED DESCRIPTION OF CERTAIN ILLUSTRATIVE EMBODIMENTS

Figure 1A:
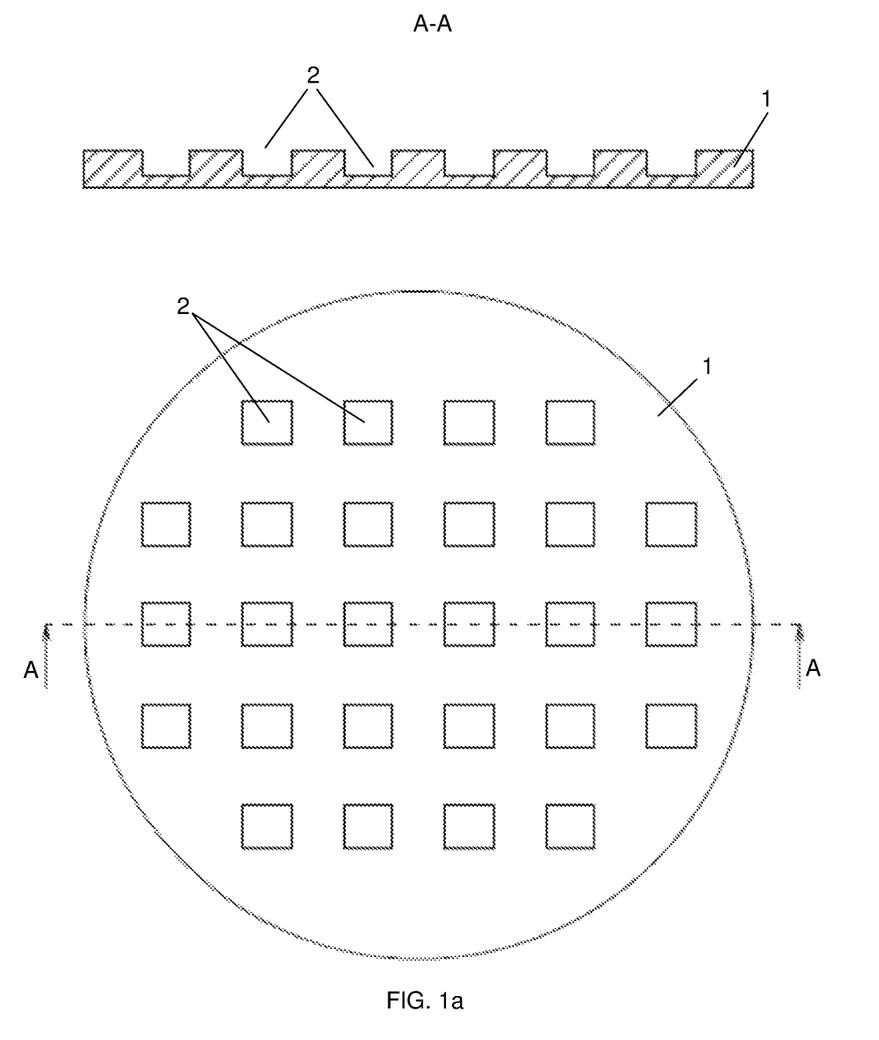
FIGS. 1a to 1m illustrate a method according to a first embodiment.

Process steps for performing the method in accordance with a first embodiment are shown in FIGS. 1a to 1m. For this first embodiment and for a second embodiment described further in this text, all materials and dimensions mentioned in the detailed description are given merely by way of example and are not limiting the scope of the disclosure. As seen in FIG. 1a, a wafer 1 is patterned by producing a regular array of rectangular cavities 2 in the wafer. The wafer 1 may for example be a standard silicon wafer of diameter 200 mm or 300 mm. The width and height of the rectangular cavities 2, as seen in the plane of the wafer, may be on the order of millimetres or centimetres, depending on the particular field of application. In the example shown, the wafer 1 is a 200 mm wafer provided with cavities 2 having a width and height of 1 to 2 cm, with the distance between two adjacent cavities 2 in the same order of magnitude. The depth of the cavities 2 may for example be about 500 μm, for a 200 mm diameter wafer 1 of about 725 μm thick. The formation of the cavities 2 is done by standard lithography and etching techniques. Possibly a layer of $SiO_2$ of about 100 nm thickness is deposited on the Si wafer 1 prior to depositing and patterning a photoresist layer (not shown), which is followed by etching the cavities 2 and stripping the resist.

Figure 1B:
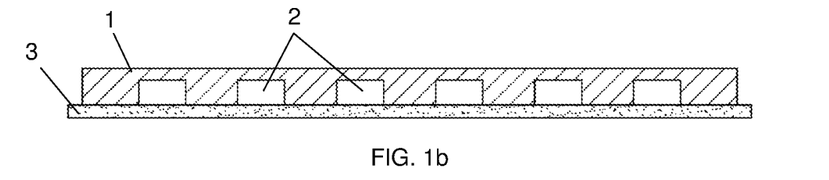
Figure 1C:
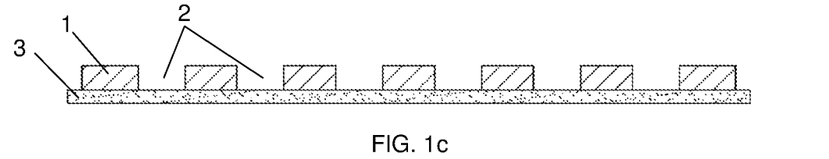
Figure 1D:
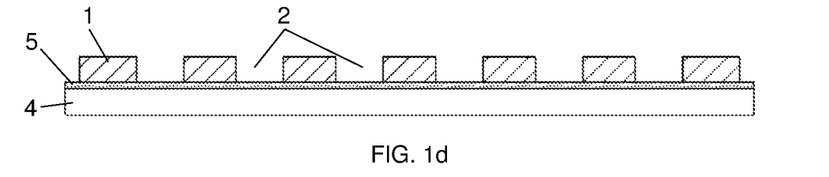

As shown in FIG. 1b, an adhesive tape 3 can be laminated on the front side of the wafer 1 (the side comprising the cavities 2) and the wafer 1 can be flipped and placed horizontally with the tape 3 lying on a support surface (not shown). A backside grinding step can be performed as illustrated in FIG. 1c, reducing the wafer thickness to about 300-400 μm, thereby revealing the cavities 2 from the back side of the wafer 1. The adhesive tape 3 can be removed, possibly followed by a cleaning step for removing residual adhesive. As illustrated in FIG. 1d, the now perforated wafer 1 can be attached to a temporary carrier wafer 4 provided with a temporary adhesive layer 5. The temporary carrier wafer 4 may for example be a standard 200 mm diameter Si wafer of about 650-725 μm in thickness. The perforated wafer 1 will hereafter also be referred to as the 'pocket wafer' 1.

Figure 1E:
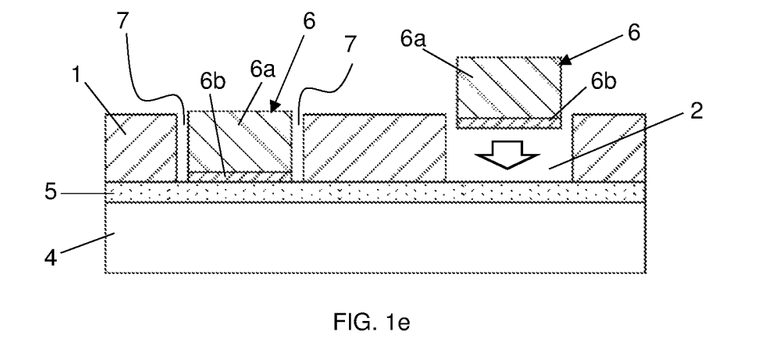

A plurality of tiles 6 can be prepared separately from the steps described so far (and illustrated in FIGS. 1a-1d). The tiles 6 can have planar dimensions which are smaller than the planar dimensions of the cavities 2, so that a tile 6 may be placed inside a cavity 2 by a standard pick-and-place tool, while a gap 7 remains between the sidewalls of the tile 6 and the sidewalls of the cavity 2. This is illustrated in FIG. 1e, in an enlarged view of a portion of the assembly shown in FIG. 1d. The tiles 6 can include a carrier portion 6a whose back side forms the back side of the tile 6 and an active material portion 6b at the front side of the tile. The active material portion 6b can be a layer or a stack of layers, at least the top layer being a layer of semiconductor material other than Si. The active material portion 6b may for example comprise at least an upper layer of III-V material such as GaN or GaAs, applicable in any of the above-described applications such as imagers, LEDs, or lasers.

The active material portion 6b can be in optimal conditions in terms of the lattice mismatch relative to the carrier portion 6a. For this purpose, the tiles 6 may be produced by epitaxial growth of the active material portion 6b, for example in the form of a single III-V layer or of a stack of different III-V layers, the epitaxial process or processes being performed on a larger carrier wafer, which may itself be a wafer formed of III-V material such as InP, for example. This carrier wafer can be cut by standard sawing techniques to form the separate tiles 6.

The top layer of the active material portion 6b may be a pristine layer of such a material, e.g., a layer that has not been processed or patterned. The top layer may however instead be a layer that has been processed or patterned prior to the cutting step for obtaining the tiles, and therefore prior to removably attaching the tiles to the temporary carrier wafer. For example, a top layer of III-V material of the tiles 6 may be processed to form mesa structures, as applicable in certain types of imagers.

A protective dielectric layer (not shown) may be deposited on the active material portion 6b prior to cutting the carrier wafer (for example on a pristine III-V surface or on a processed III-V surface), so that each tile 6 is covered on the surface of its active material portion 6b by this protective layer. This may for example be a $SiO_2$ layer of between about 50 nm and about 100 nm in thickness. When the upper surface of the active material portion is not a planar blanket surface, for example due to the formation of a pattern like the mesa-structures referred to above, the protective layer can be used in order to obtain a planar upper surface of the tiles.

The gap 7 between the tiles 6 and the sidewalls of the cavities 2 may be in the order of a few tens of micrometers, depending on the accuracy of the pick-and-place tool. The tiles 6 can be placed in the cavities 2 with the active material portion 6b facing downward and attached to the temporary adhesive layer 5 that forms the bottom of the cavities 2, so that the back side of the tiles 6 faces away from the carrier wafer 4. Alignment markers (not shown) can preferably be provided on the pocket wafer 1 in the vicinity of the cavities 2, to aid in the placement of the tiles in the cavities. The shape and dimensions of the alignment markers as well the methods applicable for producing such markers are known from pick-and-place technologies available in the prior art.

Figure 1F:
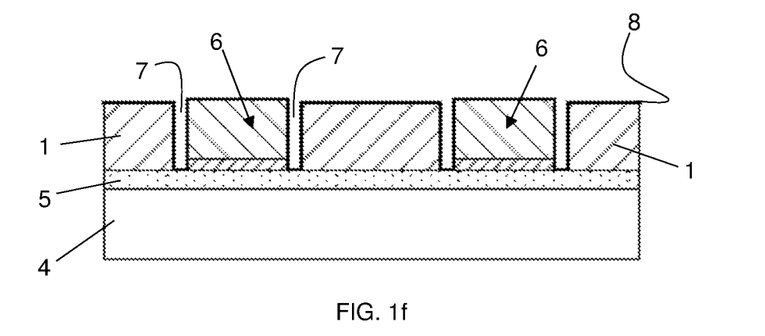

As seen in FIG. 1f, a dielectric capping layer 8 may be deposited on the exposed surfaces of the tiles 6 and of the pocket wafer 1, to protect these exposed surfaces during handling of the wafer. This may be, for example, a thin layer of $SiO_2$, less than about 100 nm thick, deposited for example by Plasma Enhanced Atomic Layer Deposition (PEALD). This layer is however an optional layer and does not represent a limitation of the invention scope.

Figure 1G:
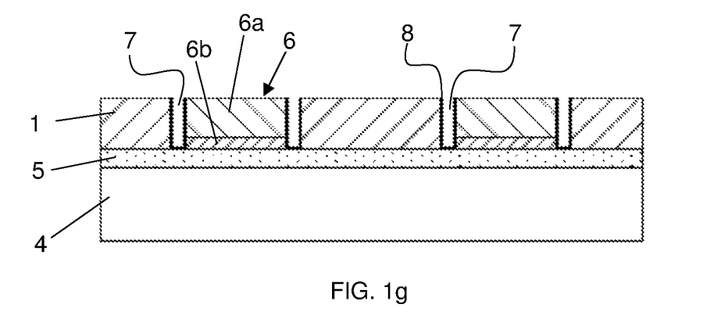

The assembly of the temporary carrier wafer 4, the pocket wafer 1 and the tiles 6 can be subjected to a planarization step for simultaneously planarizing the tiles 6 and the pocket wafer 1 from the back side, using grinding and/or other planarization methods such as CMP (chemical mechanical polishing), generally known in the art. An example result is shown in FIG. 1g: the pocket wafer 1 and the carrier portions 6a of the tiles 6 have been reduced in thickness and their exposed back surfaces have been rendered essentially coplanar. A cleaning step may be applied thereafter to remove residual particles from the grinding/thinning process.

Figure 1H:
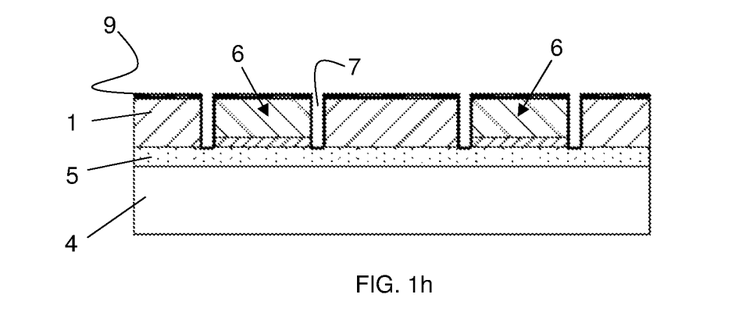

In another optional step illustrated in FIG. 1h, a further dielectric, for example $SiO_2$, capping layer 9 is produced, possibly by chemical vapour deposition (CVD), thereby covering the planarized surfaces of the pocket wafer 1 and the tiles 6. Like the layer 8, this capping layer 9 may serve as a protective layer. In addition, it may be applied to remedy irregularities or increased roughness of the back surfaces of the tiles induced by the grinding/thinning thereof. The deposition of layer 9 may increase also the $SiO_2$ thickness in the gaps 7 between the tiles 6 and the cavity walls, but this increase is not shown in the drawings in order to maintain a clear image of the gaps.

Figure 1I:
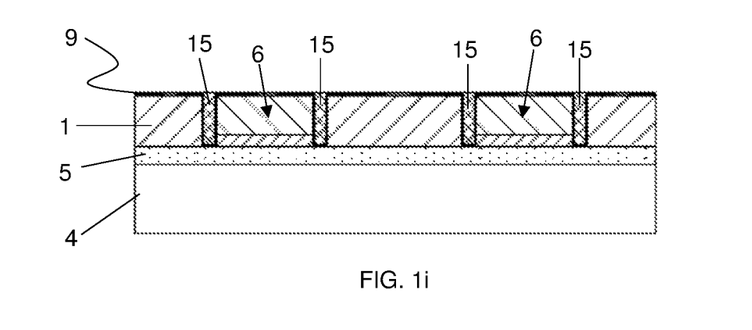

The gaps 7 can be filled, as illustrated in FIG. 1i. The material 15 used for filling the gaps may be a polymer, such as BCB (benzocyclobutene). Alternatively, the gap fill material may be another material, for example $SiO_2$. Suitable deposition processes for the above named and equivalent gap fill materials are known as such and not described here in detail. The gap fill material fills the gaps and can be deposited also on top of the tiles. The deposition can be followed by planarizing the upper surface to obtain a planar upper surface, as shown in FIG. 1i.

Figure 1J:
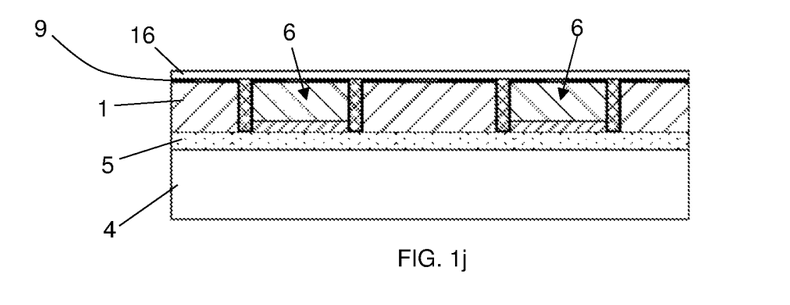
Figure 1K:
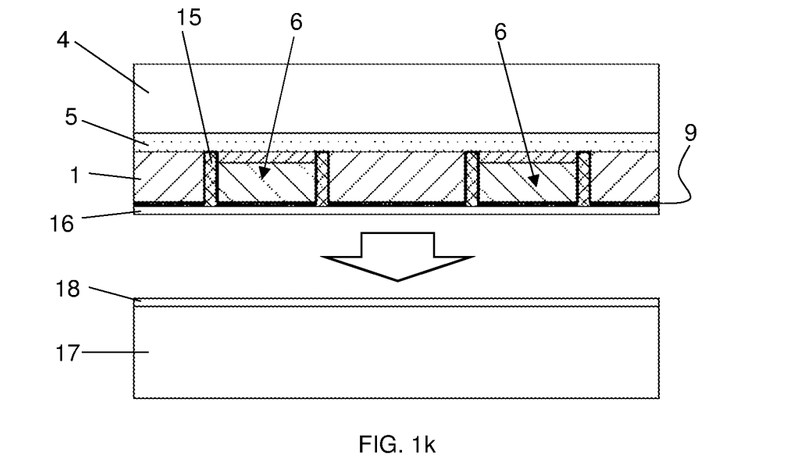
Figure 1L:
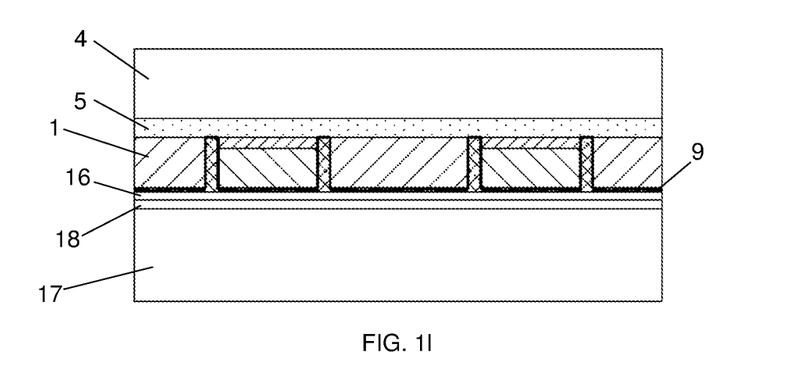

A dielectric bonding layer 16 can be deposited, as shown in FIG. 1j. This may be a layer of $SiO_2$, for example deposited by CVD. As illustrated in FIGS. 1k and 1l, the assembly can be flipped and bonded to a permanent carrier wafer 17 (e.g., a silicon wafer) also provided with a dielectric bonding layer 18. The bonding process can be a direct dielectric-to-dielectric bonding process known as such in the art, that may include a heating step for realizing a strong bond between the bonding layers 16 and 18. The temporary carrier wafer 4 can be removed by releasing the temporary bonding layer 5, optionally followed by a cleaning step for removing remaining temporary bonding material.

Figure 1M:
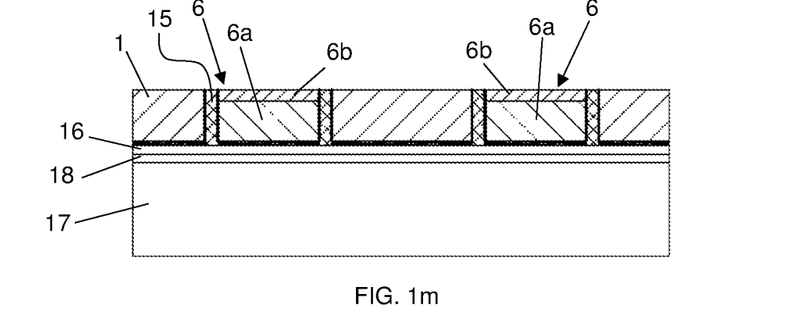

This results in the hybrid wafer in accordance with an example embodiment as shown in FIG. 1m.

The method may include one or more layer removal steps other than planarization steps before obtaining the hybrid wafer. For example, in the image shown in FIG. 1m, the capping layer 8 has been removed from the exposed gap fill material. This may be done by the above cleaning step, or by a separate removal step such as etching or solvent removal, as applicable to the material of the capping layer 8. If a protective layer is present on the active material portions 6b of the tiles, this layer may be removed also by a suitable removal step, possibly together with the capping layer 8. The hybrid wafer has a planar top surface composed of the material of the pocket wafer 1, with islands embedded in the material. The islands are formed by the pristine upper layers of the active material portions 6b of the tiles, whose surfaces are level with the surface of the pocket wafer 1. The hybrid wafer can have the same diameter as the original pocket wafer 1 and can be processed by processing tools designed for such wafer dimensions. This enables processing of the pristine III-V surfaces of the active material portions 6b of the tiles 6 by such processing tools, including advanced lithography that is so far not available on pristine non-Si wafers such as III-V semiconductors. The hybrid wafer exhibits a high degree of planarity between the pristine front surfaces of the tiles 6 and the front surface of the pocket wafer 1.

According to an alternative embodiment for obtaining the same result as shown in FIG. 1m, the gaps 7 are not filled by the gap fill material until after the step of bonding the pocket wafer 1 and the tiles 6 to the permanent carrier wafer 17 and removing the temporary carrier wafer 4. The second capping layer 9 may then for example be used as a dielectric bonding layer, for bonding the assembly shown in FIG. 1h to the bonding layer 18 of the permanent carrier wafer 17. The temporary carrier wafer 4 and the temporary adhesive layer 5 can be removed. If the capping layer 8 is present, this layer can be removed from the gap areas. The gap fill material 15 can be applied, filling the gaps 7 between the exposed tiles 6.

It is to be noted however that in this latter embodiment, the active material portions 6b of the tiles are exposed when the gap fill material is applied. This gap fill material will fill up the gaps and also form a layer on top of the tiles, that can be removed by planarization such as grinding and/or CMP. For this reason, this embodiment can include the application of a protective layer on the active material portions 6b of the tiles, as referred to above, for example a $SiO_2$ layer of about 50-100 nm in thickness. This layer can protect the pristine top layers of the tiles during planarization. If required, the thickness of the protective layer may be increased in order to ensure that the planarization does not negatively affect the pristine upper layers of the active material portions 6b. After the gap fill and planarization, the protective layer can be removed by cleaning, etching, or solvent removal.

According to a further alternative embodiment, the gaps 7 between the sidewalls of the tiles and the cavities can be very small, for example in the order of less than about 1 micrometer, which may be enabled by the use of a highly accurate pick and place tool. In that case, a method may not include a gap fill step.

In the embodiment described in FIGS. 1a to 1m, the pocket wafer 1 may be a semiconductor wafer that has not been processed, so that processing of the pocket wafer surface, for example CMOS based front end of line and back end of line processing, can take place on the hybrid wafer. The pocket wafer 1 may however already comprise processed areas prior to the production of the hybrid wafer as described above. For example, the pocket wafer 1 may be a silicon wafer comprising active transistors and conductors on one or more areas of the wafer, outside of the pockets 2, prior to the placement of the tiles 6 into the cavities.

Figure 2A:
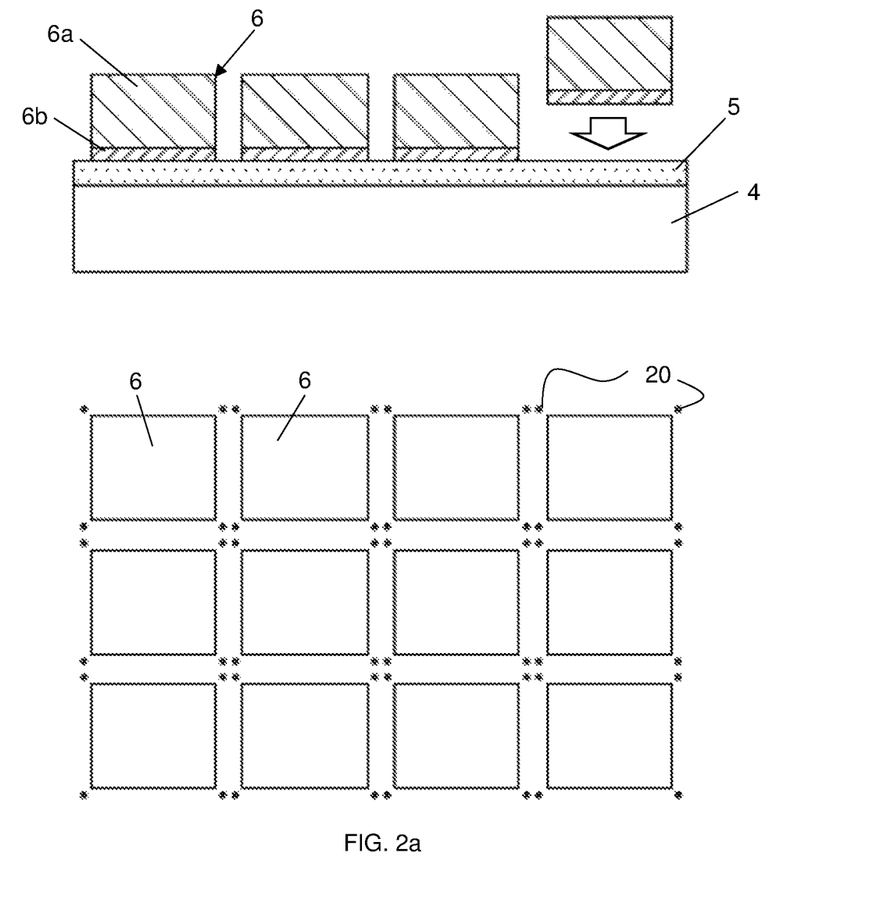
FIGS. 2a to 2g illustrate a method according to a second embodiment.

According to another embodiment, illustrated in FIGS. 2a to 2g, the hybrid wafer can be produced not by using a pocket wafer, but by first attaching the tiles 6 to the temporary carrier wafer 4 at predefined locations, using alignment markers. FIG. 2a illustrates a suitable pattern of alignment markers 20 provided on a portion of the temporary carrier wafer 4 which may be the same type of wafer used as the temporary carrier in the first embodiment, for example a 200 mm or 300 mm diameter Si wafer. Alignment markers as such are known from pick-and-place technology, for the accurate positioning of dies on a substrate by the pick-and-place tool. The markers 20 applied in this embodiment of the invention may be shaped and produced in accordance with known methods for producing such pick-and-place markers. The temporary adhesive layer 5 can be provided on the temporary carrier 4, as shown in FIG. 2a. The adhesive layer 5 can be at least partially transparent so that the markers 20 remain visible for the placement tool, for example transparent to infra-red light. The tiles 6 can be placed on the adhesive layer 5 by a pick-and-place tool. The tiles 6 can be placed with the active material portion 6b facing down and contacting the adhesive layer 5 so that the back side of the tiles faces away from the carrier wafer 4. The tiles 6 can be preferably placed in a regular pattern, using the alignment markers 20 for correct positioning. The width of the gaps between adjacent tiles 6 is not limited to any particular range. However, this embodiment is useful for producing a dense array of the tiles 6. The gaps between adjacent tiles 6 may therefore be small, for example between about 10 and about 40 μm.

Figure 2B:
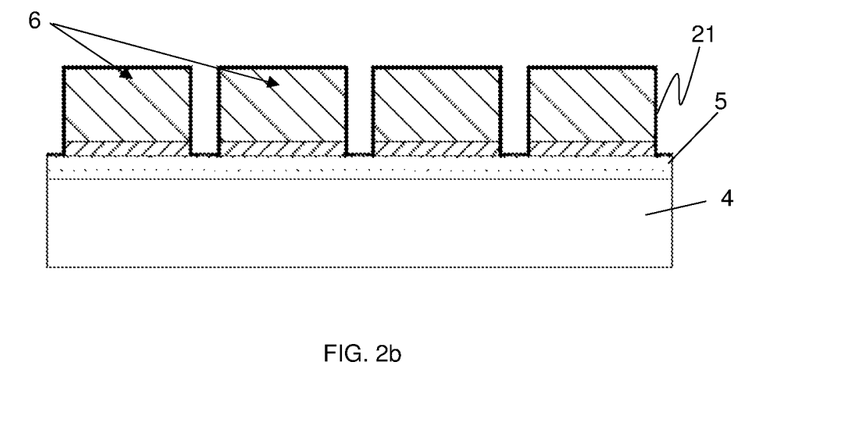
Figure 2C:
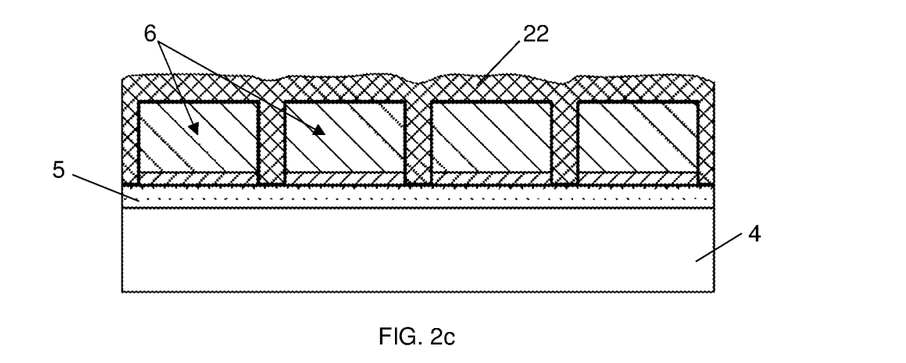
Figure 2D:
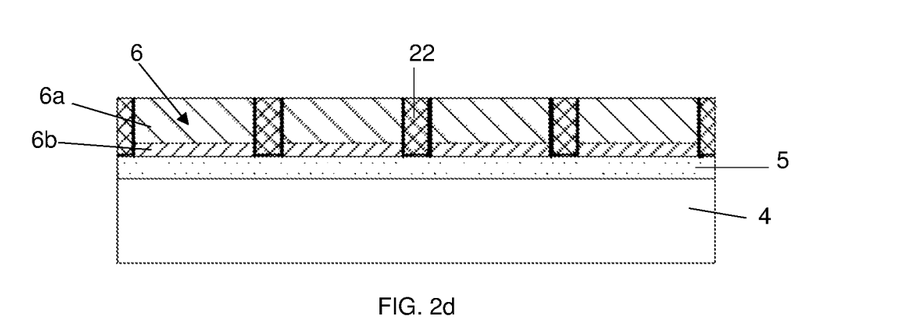

A thin $SiO_2$ capping layer 21 may optionally be deposited, as illustrated in FIG. 2b, for example by PEALD, followed by the deposition of gap fill material 22 in the spaces between the tiles 6 and on top of the tiles, as illustrated in FIG. 2c. The gap fill material may be a polymer such as BCB. Alternatively, the gap fill material may be $SiO_2$, deposited for example by PECVD. By a planarization step, such as grinding and/or CMP, the back sides of the tiles 6 and the gap fill material 22 can be thinned and planarized, as illustrated in FIG. 2d, leading to a plane surface formed of the gap fill material 22, with islands embedded therein, formed by the back surfaces of the thinned tiles 6. Alternatively, a first grinding step can be done prior to the gap filling step. A second grinding step performed after gap filling can then planarize the surface to result in the condition shown in FIG. 2d.

Figure 2E:
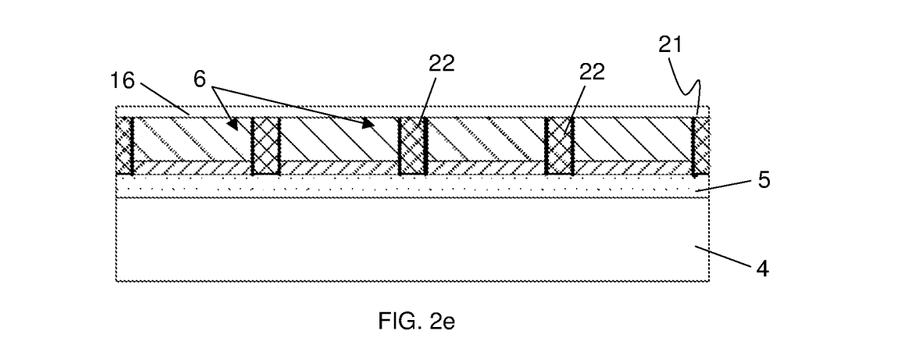
Figure 2F:
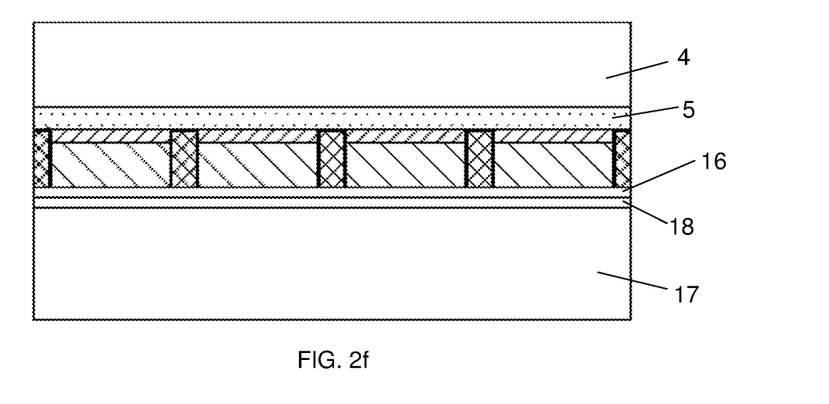
Figure 2G:
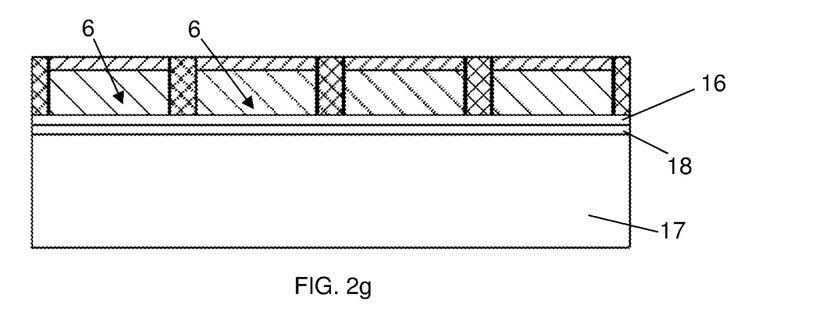

A dielectric bonding layer 16 can be deposited on this plane surface, as shown in FIG. 2e, and the temporary carrier 4 can be flipped and bonded to a permanent carrier wafer 17 that can also be provided with a dielectric bonding layer 18 (FIG. 2f). The permanent carrier wafer 17 and the bonding layers 16 and 18 may be the same in terms of thickness and material as in the first embodiment. After the bond is established, the temporary carrier wafer 4 and the temporary adhesive layer 5 can be removed, as in the previous embodiment, and the hybrid wafer can be obtained (FIG. 2g), possibly after removing by a method other than planarization a protective layer from the tiles as explained in relation to the first embodiment. The hybrid wafer comprises a planar top layer composed of the gap fill material 22, with one or more islands embedded in the gap fill material, the surface of the one or more islands being formed of the pristine top layer of the active material portions 6b of the tiles.

In a variant of the embodiment shown in FIGS. 2a to 2g, the gaps could be filled after transferring the tiles to the permanent carrier 17. This embodiment may optionally include planarizing and possibly thinning the tiles 6 from the back side starting from the condition shown in FIG. 2b (unless the back sides of the tiles are sufficiently co-planar without planarization). The method then further comprises depositing a dielectric bonding layer on the coplanar back sides of the tiles and bonding this layer to the bonding layer 18 of the permanent carrier 17, followed by the removal of the temporary carrier 4 and the adhesive layer 5. Gap filling can be performed followed by planarization to remove the gap fill material from the active material portions 6b of the tiles 6. A protective dielectric layer on the active material portions 6b of the tiles can be applied.

In any of the embodiments herein, the tiles 6 included in the hybrid wafer may have active material portions 6b which all have a top layer of the same material, but it is also possible to include tiles having active material portions with different materials of the top layer, included in the same hybrid wafer.

Regardless of how a hybrid wafer according to this disclosure has been produced, this wafer can be suitable for use in a fabrication process for the production of semiconductor components that require the specific material of the active material portions 6b of the tiles 6. As stated above, this disclosure enables production of hybrid wafers such as 200 mm or 300 mm diameter wafers, which can be processed by tools that so far have not been available for processing pristine surfaces of a number of materials, such as III-V semiconductor materials.

Figure 3:
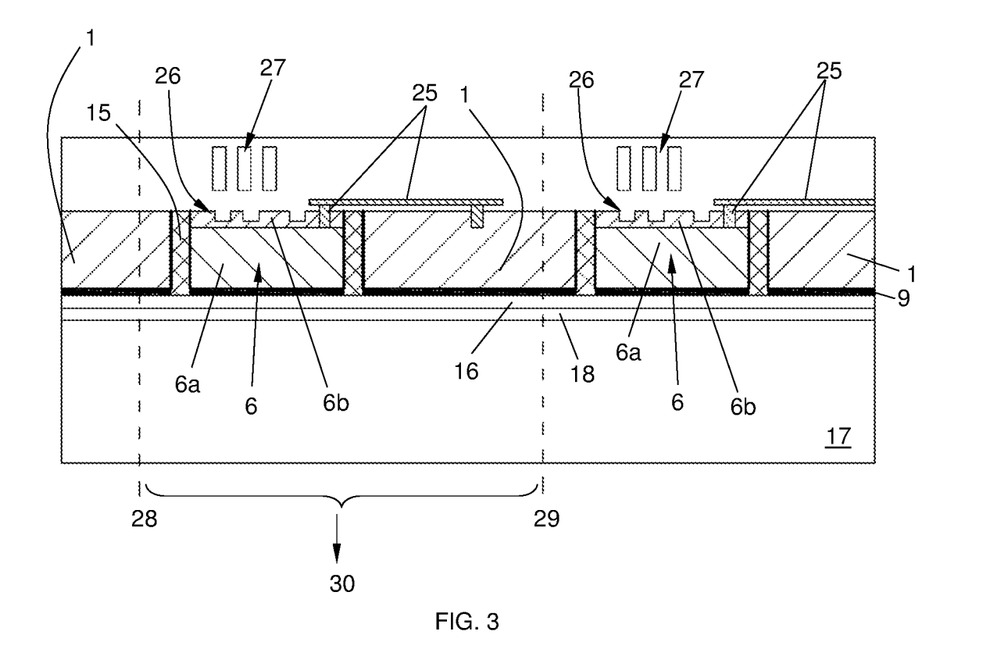
FIG. 3 illustrates how a hybrid wafer according to the invention may be further processed to produce a semiconductor component according to some embodiments.

FIG. 3 shows a schematic image of a portion of the hybrid wafer of FIG. 1m, that has been further processed, in order to produce electrical conductors 25 between a Si-portion of the pocket wafer 1 and a III-V portion 6b of the adjacent tile 6. In addition, the III-V portion 6b of the tile 6 has been processed to form a pattern 26, and optical devices 27 have been produced in association with the III-V material of the tile. The component 30 is obtained by dicing the hybrid wafer along the dotted lines 28. The component types that can be produced in this way are numerous, and include, for example, sensors, displays, or RF (Radio Frequency) components. The production steps for producing these components are known as such. However, producing them on a hybrid wafer according to the invention enables multiple improvements such as the following:

Sensors
- Use of pristine III-V substrate as focal plane
- Patterning of III-V down to sub-micron pitches
- Better alignment of different pixels
- Possibility to connect the devices (possibly coming from different tile materials) electrically with advanced metallization scheme not containing Au
- Addition of collecting optics with either metasurfaces (e.g., gratings, polarizers, meta lenses) or (micro) lenses
- Possibility to boost quantum efficiency on Si and non-Si devices (tiles) in a single process Display
- Use of pristine III-V substrates as emitter
- Possibility to produce different colors on a single wafer substrate.
- Patterning of III-V down to sub-micron pitches
- Better alignment of different emitters
- Possibility to connect the devices (coming from different tile material) electrically with advanced metallization scheme not containing Au Possibility to tailor collimation optics (meta lenses, micro lenses) onto the different tiles/colors

RF

Possibility to produce high speed transistors with low contact resistance

Possibility to electrically connect Si and III-V in a single wafer process

While various embodiments have been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of producing a hybrid wafer configured to be processed for producing one or more semiconductor components, the method comprising:

producing one or more tiles, each of the one or more tiles comprising a carrier portion and an active material portion on the carrier portion such that a back side of the carrier portion forms a back side of each of the one or more tiles and the active material portion is located at a front side of each of the one or more tiles;

producing an assembly, the assembly comprising:
a temporary carrier wafer, and
the one or more tiles, wherein the one or more tiles are removably attached face down to the temporary carrier wafer, such that the back sides of the one or more tiles are facing away from the temporary carrier wafer;

bonding the assembly to a permanent carrier wafer by bonding the back sides of the one or more tiles to the permanent carrier wafer, wherein a continuous layer surrounds the one or more tiles, wherein the continuous layer is either part of the assembly or is formed after bonding the assembly to the permanent carrier wafer, and wherein the continuous layer is formed of a material that is different from at least a top layer of the active material portion; and removing the temporary carrier wafer, thereby obtaining the hybrid wafer, the hybrid wafer comprising the permanent carrier wafer having bonded thereto a planar top layer formed of the material of the continuous layer with one or more islands embedded therein, the top layer of the one or more islands being formed by the top layer of the active material portion of the one or more tiles.

2. The method according to claim 1 wherein:

the assembly comprises the continuous layer surrounding each of the one or more tiles, wherein the continuous layer is also removably attached to the temporary carrier wafer, so that the back side of the continuous layer is facing away from the temporary carrier wafer, the method further comprising:
planarizing the assembly, so that the back sides of the one or more tiles and of the continuous layer are rendered essentially co-planar, and
bonding the assembly to the permanent carrier wafer by bonding the co-planar back sides of the one or more tiles and of the continuous layer to the permanent carrier wafer.

3. The method according to claim 2, wherein the continuous layer is formed by a pocket wafer, and wherein producing the assembly further comprises:

producing the pocket wafer, the pocket wafer comprising one or more cavities through a complete thickness of the pocket wafer, a shape of the one or more cavities corresponding respectively to a shape of the one or more tiles so that the one or more tiles can be placed respectively inside the one or more cavities,
removably attaching the pocket wafer to the temporary carrier wafer, and
placing the one or more tiles face down inside the respective one or more cavities.

4. The method according to claim 3, further comprising filling gaps remaining between the one or more tiles and sidewalls of the respective cavities after the one or more tiles have been placed inside the cavities.

5. The method according to claim 4, wherein the one or more tiles further comprise a protective layer on the active material portion, and wherein filling the gaps takes place after bonding the assembly to the permanent carrier wafer and comprises:
depositing a gap fill material in the gaps and on top of the one or more tiles, and wherein the method includes planarizing the gap fill material and removing the protective layer.

6. The method according to claim 3, wherein the pocket wafer is a semiconductor wafer, and wherein the active material portion of the one or more tiles comprises at least a top layer of a III-V semiconductor material.

7. The method according to claim 3, wherein the pocket wafer and the permanent carrier wafer are semiconductor wafers having a diameter of 200 mm or 300 mm.

8. The method according to claim 3, wherein a first capping layer is formed on the one or more tiles and on the pocket wafer, after placing the one or more tiles in the cavities, and before planarizing the assembly.

9. The method according to claim 3, wherein a dielectric capping and/or bonding layer is formed on the one or more tiles and on the pocket wafer, after planarizing the assembly.

10. The method according to claim 3, wherein the temporary carrier wafer is provided with a temporary adhesive layer, wherein the one or more tiles are removably attached to the temporary adhesive layer, and wherein the method further includes removing the temporary adhesive layer.

11. The method according to claim 2, wherein producing the assembly comprises:
producing one or more alignment markers on the temporary carrier wafer,
producing a temporary adhesive layer on the temporary carrier wafer,
attaching the one or more tiles to the temporary adhesive layer, using the one or more alignment markers for positioning the one or more tiles, thereby removably attaching the one or more tiles to the carrier wafer, and
depositing a layer of the material on the temporary adhesive layer in an area surrounding each of the one or more tiles and on top of the one or more tiles, wherein the layer forms the continuous layer surrounding each of the one or more tiles,
and wherein the method includes removing the temporary adhesive layer.

12. The method according to claim 1, wherein the one or more tiles further comprise a protective layer on the active material portion, wherein the continuous layer is not part of the assembly, and wherein producing the assembly comprises:
producing one or more alignment markers on the temporary carrier wafer, and
removably attaching the one or more tiles to the temporary carrier wafer using the one or more alignment markers for positioning the one or more tiles,
wherein the method further comprises:
bonding the back sides of the one or more tiles to the permanent carrier wafer,
removing the temporary carrier wafer,
depositing a layer of the material in an area surrounding each of the one or more tiles and on top of the one or more tiles, wherein the layer forms the continuous layer surrounding each of the one or more tiles, and
planarizing the continuous layer and removing the protective layer from the active material portion of the one or more tiles, thereby obtaining the hybrid wafer.

13. The method according to claim 1, wherein the active material portion of the one or more tiles comprises one or more layers that have been processed and/or patterned prior to producing the one or more tiles.

14. A method for producing at least one semiconductor component, the method comprising:
providing the hybrid wafer produced according to the method of claim 1,
processing the hybrid wafer to thereby produce a semiconductor component on an area comprising a portion of the continuous layer and the one or more of islands, and
separating the semiconductor component from the rest of the hybrid wafer.

15. The method of claim 1, wherein the active material portion comprises a semiconductor material suitable for processing active semiconductor devices thereon.

16. The method of claim 1, wherein the active material portion comprises a second material suitable for patterning of the material.

17. The method of claim 1, wherein the active material portion is a pristine layer that has not been processed or patterned.

18. The method of claim 1, wherein the active material portion comprises the top layer, wherein the top layer is a pristine layer.

19. The method of claim 1, wherein the active material portion comprises the top layer, wherein the top layer has been processed or patterned before being removable attached to the temporary carrier wafer.

20. The method of claim 1, wherein prior to bonding the assembly to the permanent carrier wafer, planarizing the assembly, such that the back side of each of the one or more tiles is rendered essentially coplanar.

21. The method of claim 1, further comprising one or more additional layers on the active material portion.

22. The method of claim 21, further comprising removing the one or more additional layers after removing the temporary carrier wafer.

* * * * *